United States Patent [19]
Cloud et al.

[11] Patent Number: 5,815,427
[45] Date of Patent: Sep. 29, 1998

[54] MODULAR MEMORY CIRCUIT AND METHOD FOR FORMING SAME

[75] Inventors: Eugene H. Cloud; Brent Keeth; Salman Akram; James M. Shaffer; Alex Closson, all of Boise, Id.

[73] Assignee: Micron Technology, Inc., Boise, Id.

[21] Appl. No.: 825,871

[22] Filed: Apr. 2, 1997

[51] Int. Cl.[6] ............................. G11C 5/02; G11C 5/06; G11C 8/00

[52] U.S. Cl. ............................. 365/51; 365/63; 365/233; 257/706

[58] Field of Search ...................... 365/51, 63, 189.01, 365/189.02, 194, 200, 201, 230.02, 230.06, 233; 257/706; 364/232.7

[56] References Cited

U.S. PATENT DOCUMENTS

| | | | |
|---|---|---|---|
| 3,577,037 | 5/1971 | Di Pietro | 257/621 |
| 3,986,171 | 10/1976 | Valassis et al. | 364/232.7 |
| 4,007,452 | 2/1977 | Hoff, Jr. | 365/63 |
| 4,021,838 | 5/1977 | Warwick | 257/777 |
| 4,025,903 | 5/1977 | Kaufman et al. | 364/232.7 |
| 4,074,342 | 2/1978 | Honn et al. | 361/779 |
| 4,208,698 | 6/1980 | Narasaimhan | 361/793 |
| 4,553,192 | 11/1985 | Babuka et al. | 361/743 |
| 4,672,421 | 6/1987 | Lin | 257/777 |
| 4,698,662 | 10/1987 | Young et al. | 257/777 |
| 4,749,947 | 6/1988 | Gheewala | 371/22.6 |
| 4,752,911 | 6/1988 | Prevost et al. | 365/51 |
| 4,811,082 | 3/1989 | Jacobs et al. | 257/700 |
| 4,882,298 | 11/1989 | Moeller et al. | 438/125 |
| 4,958,258 | 9/1990 | Charruan | 361/715 |
| 5,097,318 | 3/1992 | Tanaka et al. | 257/690 |
| 5,198,963 | 3/1993 | Gupta et al. | 361/715 |
| 5,266,834 | 11/1993 | Nishi et al. | 257/706 |
| 5,419,807 | 5/1995 | Akram et al. | 324/500 |
| 5,534,465 | 7/1996 | Frye et al. | 438/108 |

FOREIGN PATENT DOCUMENTS

| | | |
|---|---|---|
| 54-23484 | 2/1979 | Japan . |
| 61-101067 | 5/1986 | Japan . |
| 3-321450 | 10/1991 | Japan . |

OTHER PUBLICATIONS

Bodendorf, D.J., et al., "Active Silicon Chip Carrier,":*IBM Technical Disclosure Bulletin*, 15(2):656–657, Jul. 1972.

*Primary Examiner*—David C. Nelms
*Assistant Examiner*—Trong Phan
*Attorney, Agent, or Firm*—Seed and Berry LLP

[57] ABSTRACT

A modular circuit includes a memory module that has an array of memory cells, a communication module that has communication circuitry for coupling signals between the array and external circuitry, and an interconnection module that electrically interconnects the array on the memory module and the communication circuitry on the communication module. The memory and communication modules may also be mounted to the interconnection module. Alternatively, the memory and interface modules may be electrically interconnected and mounted to each other, in which case the interconnection module is not required.

49 Claims, 4 Drawing Sheets

MODULAR MEMORY CIRCUIT AND METHOD FOR FORMING SAME

TECHNICAL FIELD

The present invention relates generally to memory circuits and more specifically to a memory circuit that is constructed from a plurality of circuit modules, and a method for forming such a modular memory circuit.

BACKGROUND OF THE INVENTION

Many integrated circuits, such as memory circuits, are formed on a single silicon die. The die is packaged, and the packaged circuit, which is often called a monolithic circuit because it is formed on a single die, is sold to consumers for use in larger electronic systems.

As technology advances, consumers continue to demand that such integrated circuits have a smaller size, perform more functions, and in the case of memory circuits, store more data than their predecessors. Thus, the density of the circuit components, such as transistors, continues to increase.

But as circuit sizes decrease and component densities increase, the manufacturing field of such circuits typically decreases. For example, as the minimum feature size (i.e., the minimum width of a feature such as a bit line or transistor gate) decreases to accommodate increased component density, one must achieve a depth of focus within an increasingly narrowing range for microlithography purposes. Therefore, it becomes more difficult to properly resolve two separate and distinct component features that have different heights. Additionally, as the height differences between different features decrease, chemical-mechanical planarization (CMP) techniques may become less effective or even unusable. Furthermore, certain materials, such as metals, easily migrate through silicon. Therefore, as component density increases, if different sections of a circuit are processed using different techniques and temperatures, it is possible that such materials may migrate from one section of the circuit into another section where they may cause damage. Additionally, certain process parameters may be incompatible with one another. For example, in a memory device, it is often desired that the storage transistors have a low leakage current, but that the communication transistors exhibit a higher leakage current so that they can operate at a higher speed. These two different sets of transistors are often formed using different processing techniques. But as increasing component densities force different types of transistors closer together, the processing steps used to form one set of transistors may undesirably affect the formation and operational characteristics of another set of transistors. Moreover, increased component densities often make repair of defective circuits difficult or impossible. Thus, such defective circuits are often discarded and the materials they are made from wasted.

Furthermore, a consumer may demand that an integrated circuit be customized to perform functions that are specific to his application. Such custom integrated circuits may be difficult and costly to produce. For example, two different custom models of the same memory device may have identical array circuitry but slightly different input/output circuitry. Thus, each model is typically manufactured using different processing steps and masks to effectuate the differences between the two models no matter how few or insignificant they may be. If there are a greater number or more significant differences between them, then each model may even require its own processing run.

SUMMARY OF THE INVENTION

In accordance with one embodiment of the invention, a modular circuit is provided. The circuit includes a memory module that is formed on a first die and that has an array of memory cells, a communication module that is formed on a second die and that has interface circuitry for coupling signals to or from the array, and an interconnection module that is formed on a third die and that electrically interconnects the array on the memory module and the communication circuitry on the communication module.

Advantages provided by the invention include higher manufacturing yield, the ability to customize circuits with fewer changes to the processing sequence and with greater speed and cost effectiveness, and the ability to form circuits from partially defective modules.

DETAILED DESCRIPTION OF THE INVENTION

Figure 1:
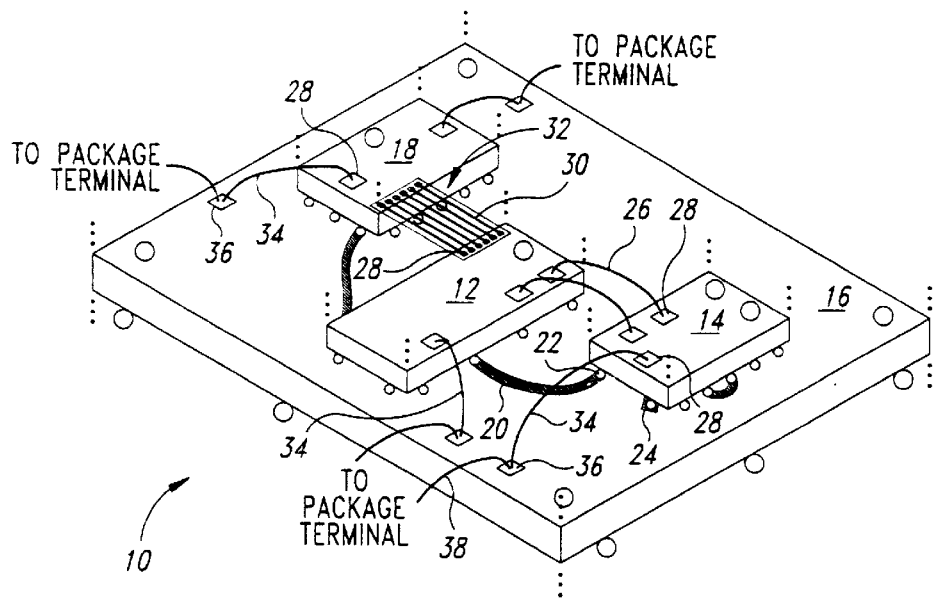
FIG. 1 is an isometric view of a modular memory device according to a first embodiment of the invention.

FIG. 1 is an isometric view of a modular memory device 10 according to a first embodiment of the invention. However, it is understood that modular devices other than memory devices may have a structure and be formed in accordance with the principles of the invention. The memory device 10 includes a memory module 12, which in one embodiment of the invention includes an array of conventional memory cells, conventional read/write circuitry such as sense amplifiers and write drivers, and address circuitry such as an address decoder for accessing the memory cells (none shown in FIG. 1). An interface module 14 includes interface circuitry, such as conventional input/output (I/O) buffers, that provide an interface between the read/write circuitry of the memory module 12 and an external data bus. An interconnection module 16 provides a mounting platform for the modules 12 and 14 and also provides conductive interconnection traces 20. As discussed below, the interconnection module 16 may also include circuitry of its own. In other embodiments of the invention, a peripheral module 18, such as a microprocessor module, may also be included to perform additional functions such as to manipulate the data stored in the array of the memory module 12. In embodiments of the invention in which the memory module 12 does not include an address decoder, the peripheral module 18 may be an address decoder module or another type of module that includes addressing circuitry. After assembly, the modular memory device 10 is packaged in a conventional manner for use in electronic systems.

More specifically, the memory and interface modules 12 and 14, and the peripheral module 18 when included, are mounted to the interconnection module 16 using a conventional technique such as epoxy bonding. The modules 12 and 14 are electrically coupled to the traces 20 on the module 16 by a conventional coupling technique such as flip-chip, ball-grid array (BGA), pin-grid array (PGA), or silicon micromachined tips (known good die [KGD] tips). For example purposes, BGA interconnection balls 22 are shown electrically coupling the modules 12 and 14 to the traces 20. The balls 22 are formed from conventional conductive materials such as solder or conductive epoxy. In another embodiment of the invention, the balls 22 are also used to mount the modules 12 and 14 to the module 16. In such an embodiment, electrically isolated pads 24 may be provided as additional mounting points to strengthen the physical bond between the module 16 and the modules 12, 14, and 18. In addition to being electrically interconnected via the traces 20, the modules 12 and 14 may also include conductive pads 28, which are electrically interconnected with conventional wire bonds 26, the conductors 30 of conventional automated-bonding tape 32, or other conventional coupling means. The module 16 is coupled to the external terminals of the package (not shown in FIG. 1) via the conductive pads 36 and the wire bonds 38. The modules 12, 14, and 18 may be coupled to the external terminals either via the traces 20 that are coupled to respective ones of the conductive pads 36, or via the wire bonds 34, which are also coupled to respective ones of the pads 36. In another embodiment of the invention, some or all of the pads 28 of the modules 12, 14, and 18 are directly coupled to the external terminals via the wire bonds 34.

In one embodiment of the invention, the modules 12 and 14 are monocrystalline silicon dies that have the appropriate circuitry formed thereon. The module 16 is either a monocrystalline silicon (i.e., "monosilicon") or a polycrystalline silicon ("polysilicon") die where the traces 20 are formed from doped regions of silicon. In another embodiment, the interconnecting module 16 is an amorphous silicon die, which may be formed on a square or rectangular wafer instead of the circular wafers required for monosilicon or polysilicon dies. Because dies are typically square or rectangular regardless of the wafer shape, a square or rectangular wafer has significantly more usable area than a circular wafer. In other embodiments of the invention, the module 16 is not formed on a silicon die, but is a printed-circuit-board (PCB) type structure formed from other conventional materials, including but not limited to polyimide, FR-4, glass, fiberglass, and ceramic. In such embodiments, the traces 20 and the pads 24 and 36 may be conventionally formed from a conductive material such as metal.

Still referring to FIG. 1, in other embodiments of the invention, one or more of the modules 12, 14, 16, or 18 may be stacked one on top of the other to form larger and more complex memory devices. The coupling between such stacked modules is similar to the described coupling between the modules 12, 14, 16, and 18.

In one embodiment of the invention, each of the modules 12, 14, 16, and 18 are tested individually before the memory device 10 is assembled. This individual testing may be performed by conventional built-in-self-test (BIST) circuitry associated with each of the modules. Such test circuitry typically allows testing of the functional circuitry on the modules at a level that can substantially pinpoint the defective portion or portions of the functional circuitry. If the modules are tested at the wafer level, the BIST circuitry may be disposed in the scribe lines or in the unused edge portions of the wafer in order to minimize the surface areas of the module dies. Alternatively, the BIST circuitry may be included on the modules themselves. Furthermore, after it is assembled, the memory device 10 may be tested to ensure that the modules are properly interconnected and function together properly. In another embodiment of the invention, the modules are not tested individually before assembly, and all of the testing is performed after the memory device 10 has been assembled.

Because the modules 12, 14, 16, and 18 can be formed independently of one another, specific processing techniques and parameters that are used to form one module need not adversely affect the formation of the other modules. Furthermore, modifications to the same product line can be made without varying the processing routines of the different modules. For example, suppose the memory device 10 is a dynamic random access memory (DRAM). Different versions of the memory device 10 may use the same memory array but with different interfaces, such as extended-data-out (EDO), fast-page-mode, or rambus DRAM interfaces. Thus, instead of forming each of these versions monolithically on a wafer using different processing routines, one can manufacture multiple types of interface modules 14 and one type of memory module 12, and then build the different versions from the appropriate modules. Therefore, the memory module 12 is not subjected to the different process parameters for the interface modules 14.

In another embodiment of the invention, each of the modules 12, 14, 16, and 18 are separately tested as discussed above, and then each type of module is sorted by degree of defectiveness before the memory devices are constructed. For example, suppose the memory device 10 is a 4-megabit (mb) device and that each memory module 12 includes a 1-mb array. Therefore the memory device 10 can be constructed with four fully functional modules 12. But for example, if there are some memory modules 12 having only half of their memory cells functional, then the memory device 10 can be constructed with eight such modules 12. Therefore, because once the memory device 10 is packaged the number and type of modules used are transparent to the user, even partially defective modules 12, 14, 16, and 18 can be used to form fully functional memory devices 10. Such use of partially defective modules can dramatically increase the overall yield of the manufacturing process.

Figure 2:
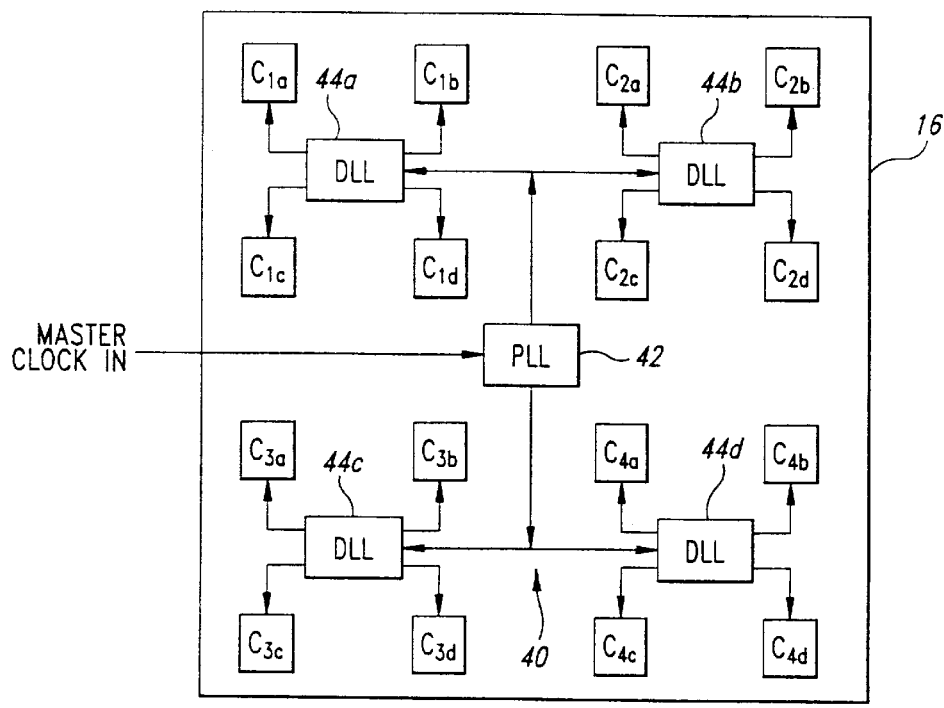
FIG. 2 is a block diagram of one embodiment of the interconnection module of FIG. 1.

FIG. 2 is a block diagram of one embodiment of the interconnection module 16 of FIG. 1. In addition to the traces 20 and the pads 24 and 36 (FIG. 1), this embodiment of the module 16 includes a clock distribution circuit 40, which distributes precisely timed clock signals to the modules, such as modules 12 and 14 (FIG. 1), that are coupled to the module 16. The circuit 40 includes a conventional phase-locked loop (PLL) 42, which receives a master clock signal and generates a synchronized signal therefrom. Conventional delay-locked loops (DLL) 44a–d respectively convert the synchronized signal into clock signals C1a–d, C2a–d, C3a–d, and C4a–d, which are respectively provided to the modules that are coupled to the module 16. Thus, the circuit 40 ensures that any propagation delays that the module 16 introduces to the master clock signal have little or no affect on the timing between the interconnected modules.

Figure 3:
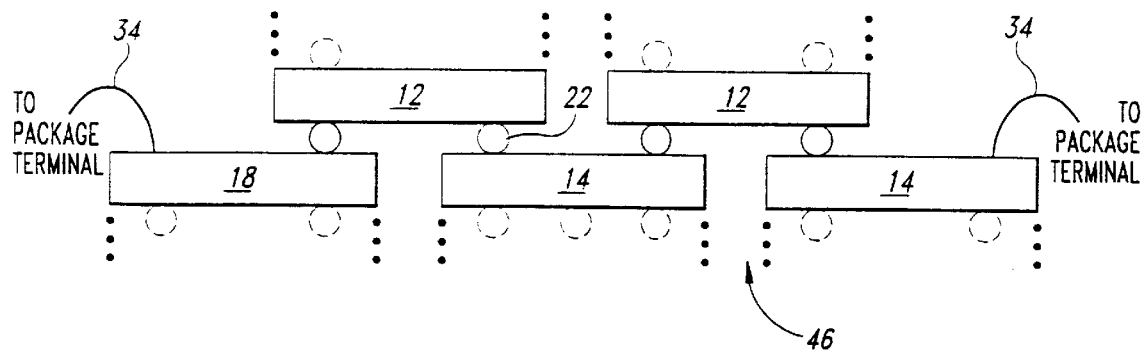
FIG. 3 is a side elevational view of a modular memory device according to a second embodiment of the invention.

FIG. 3 is a side elevational view of an integrated device 46 according to a second embodiment of the invention. The integrated device 46 is similar to the device 10 of FIG. 1 except that it does not include an interconnecting module 16. Instead, the modules 12, 14, and, when included, 18, are directly mounted to one another. As discussed above in conjunction with FIG. 1, such mounting may be accomplished by using conventional epoxy techniques or by using an electrical coupling structure such as BGA. Furthermore, like the device 10 of FIG. 1, the modules 12, 14, and 18 may be stacked as indicated by the dotted lines and the connecting balls 22 shown in dashed line. Additionally, the wire bonds 34 are coupled directly between the pads 28 of the modules and the terminals of the package (not shown in FIG. 3).

Figure 4:
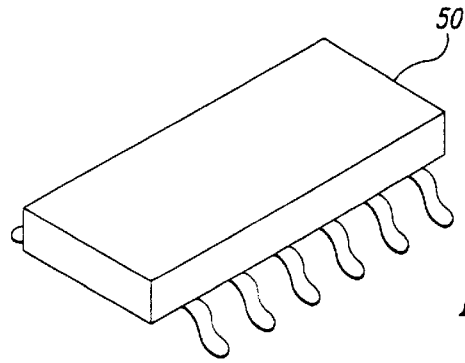
FIG. 4 is an isometric view of one embodiment of a package that can be used to house the modular memory circuits of FIGS. 1 and 3.

FIG. 4 is an isometric view of a conventional electronic package 50, which can be used to house the modular devices 10 and 46 of FIGS. 1 and 3, respectively. The package 50 can be the same as or similar to packages that are used to house conventional monolithic integrated circuits. Therefore, as discussed above in conjunction with FIG. 1, the modular structures of the devices 10 and 46 are transparent to the user.

Figure 5:
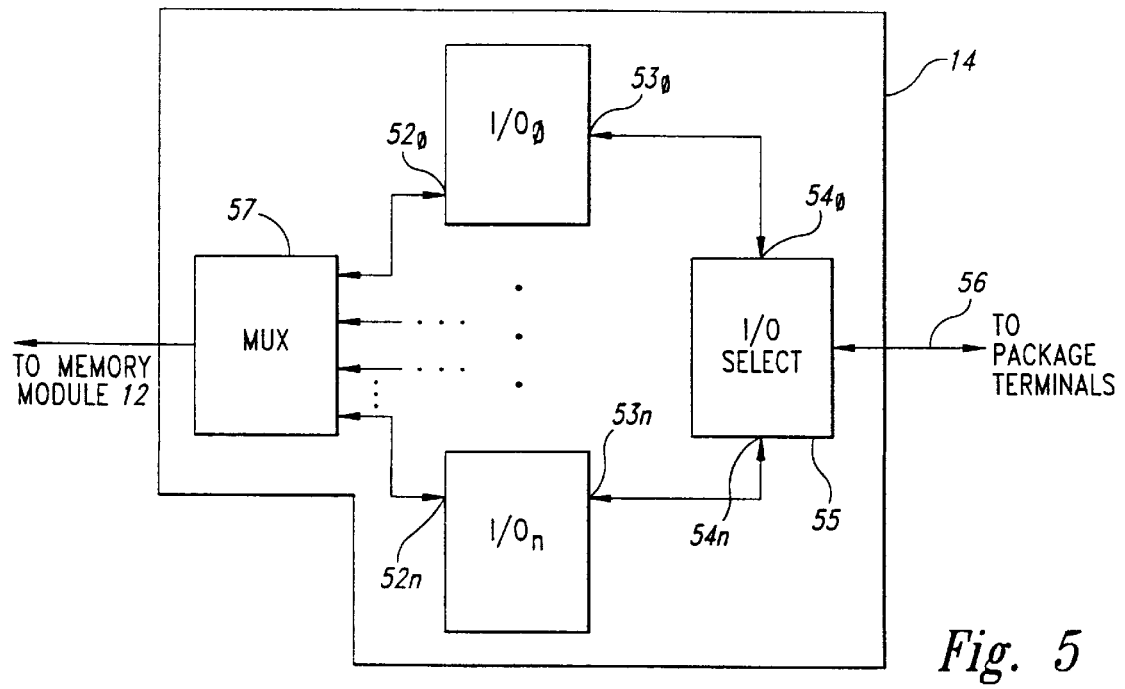
FIG. 5 is a block diagram of one embodiment of an interface module that can be used with the modular memory devices of FIGS. 1 and 3.

FIG. 5 is a block diagram of one embodiment of the interface module 14 of FIGS. 1 and 3. This embodiment of the module 14 is configurable to provide a selected one of a number of different types of conventional interfaces to circuits external to the memory device 10. Specifically, the module 14 includes a number of I/O circuits $I/O_0$–$I/O_n$, which each perform a different I/O function. Each of these I/O circuits has a respective terminal 52 that is coupled to the memory module 12 using the structures and techniques discussed above. In one embodiment, the module 14 includes a multiplexer circuit 57, which is coupled between the memory module 12 and the terminals $52_0$–$52_n$ of the I/O circuits $I/O_0$–$I/O_n$ so that only the selected I/O circuit is coupled to the memory module 12. Each I/O circuit $I/O_0$–$I/O_n$ also has a respective terminal 53 that is coupled to a respective input terminal 54 of an I/O-select circuit 55, which includes a conventional multiplexer that couples a selected one of the I/O circuits $I/O_0$–$I/O_n$ to an output bus 56. In one embodiment of the invention, the output bus 56 is coupled to a terminal of the package for the memory device 10 using the structures and techniques described above. For example, the configurable module 14 may include a TTL interface, a CMOS interface, and an ECL interface. Depending upon the type of interface that the memory device 10 must present to external circuitry, one programs the I/O-select circuit 55 in a conventional manner to couple the appropriate one of the I/O circuits $I/O_0$–$I/O_n$ to the output bus 56. For example, in one embodiment of the invention, such programming is accomplished by programming conventional programmable elements, such as laser fuses, electrical fuses, or antifuses, before the memory device 10 is packaged. In another embodiment, the circuit 55 is programmed by using a mask during the processing of the module 14 to form the appropriate circuit interconnections. In yet another embodiment, the circuit 55 is programmable using conventional software techniques such that the interface module 14 can be configured and reconfigured even after the memory device 10 has been packaged.

An advantage of such a configurable module 14, particularly where programmable elements or software are used to program the circuit 55, is that only one type of module 14 need be manufactured for multiple versions of the memory device 10. Thus, because only one process need be implemented to form the one type of module 14, the processing costs can be significantly reduced. Furthermore, if one type of interface becomes obsolete, the configurable modules 14 can still be used for other types of interfaces, and need not be discarded.

Figure 6:
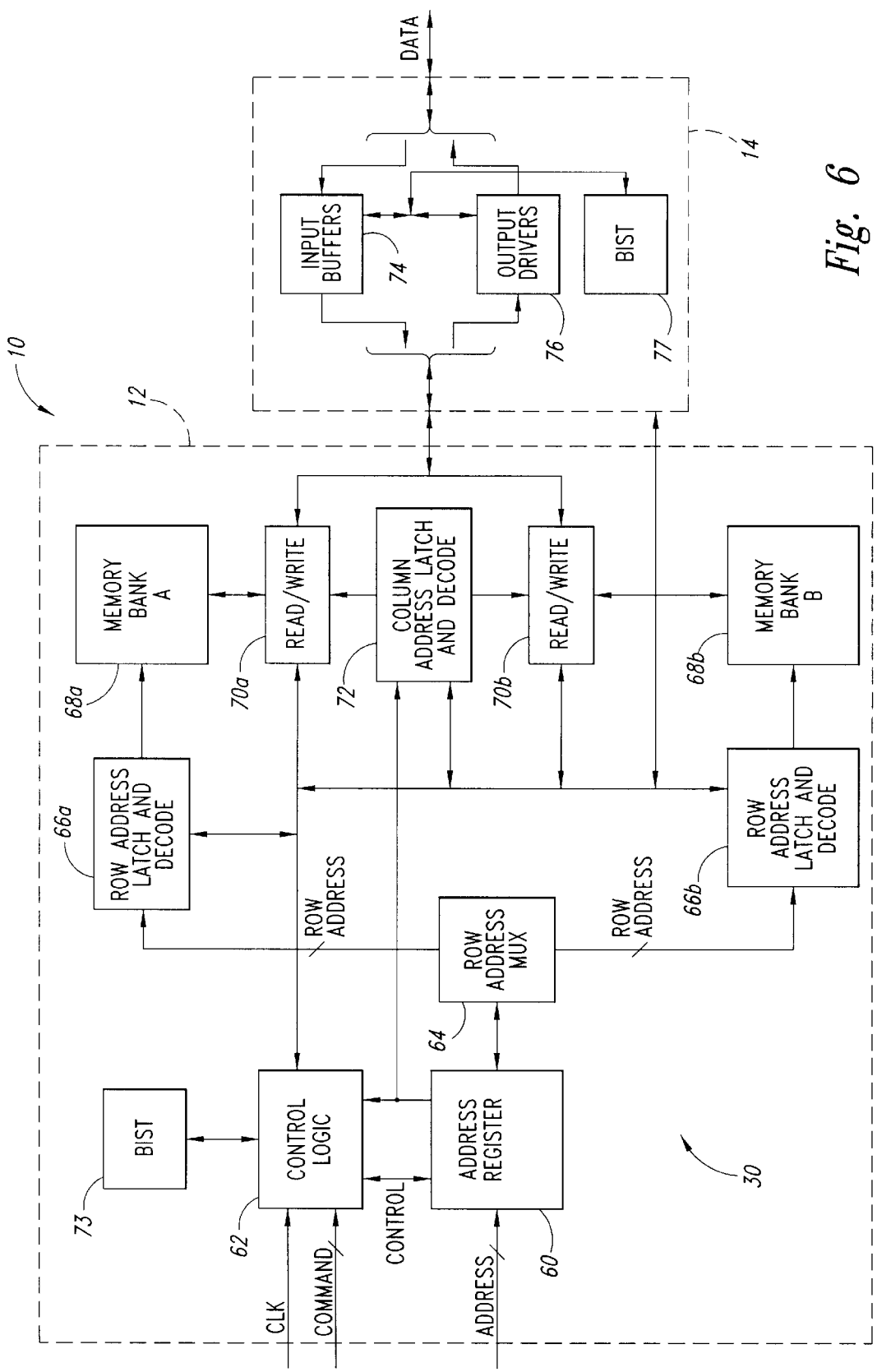
FIG. 6 is a block diagram of one embodiment of the modular memory devices of FIGS. 1 and 3.

FIG. 6 is a schematic block diagram of one embodiment of the memory device 10 of FIG. 1, and is also a schematic block diagram of one embodiment of the memory device 46 of FIG. 3. But for clarity, FIG. 6 is hereinafter described with reference to the memory device 10 of FIG. 1. In one embodiment of the invention, the memory device 10 is a synchronous dynamic random access memory (SDRAM), although in other embodiments, the memory device 10 may be another type of memory device.

Still referring to FIG. 6, the memory module 12 includes an address register 60, which receives an address from an ADDRESS bus. A control logic circuit 62 receives CLK and COMMAND signals, and communicates with and controls the other circuits of the memory module 12. If the memory device 10 is a SDRAM, then all of the input signals and output signals, as well as many of the internal signals, are synchronized to the CLK signal. A row-address multiplexer 64 receives the address signal from the address register 60, and provides the row address to row-address latch-and-decode circuits 66a and 66b. During read and write cycles, the row-address latch-and-decode circuits 66a and 66b activate the word lines of the addressed rows of memory cells in memory banks 68a and 68b, respectively. Read/write circuits 70a and 70b, respectively, read data from the addressed memory cells in the memory banks 68a and 68b during a read cycle, and respectively write data to the addressed memory cells during a write cycle. A column-address latch-and-decode circuit 72 receives the address from the address register 60 and provides the column address of the selected memory cells to the read/write circuits 70a and 70b. For clarity, the address registers 60, the row-address multiplexer 64, the row-address latch-and-decode circuits 66a and 66b, and the column-address latch-and-decode circuit 72 can be collectively referred to as the address decoder. The memory module 12 may also include a BIST circuit 73 for testing the circuitry on the module 12 as discussed above in conjunction with FIG. 1.

The interface module 14 includes a plurality of input buffers 74. During a write cycle, the buffers 74 receive and store data from the DATA bus, and the read/write circuits 70a and 70b, respectively, provide this stored data to the memory banks 68a and 68b. The module 14 also includes a plurality of output drivers 76. During a read cycle, the read/write circuits 70a and 70b respectively provide data from the memory banks 68a and 68b to the drivers 76, which in turn drive this data onto the DATA bus. The interface module 14 may also include a BIST circuit 77 for testing the circuitry on the module 14 as discussed above in conjunction with FIG. 1.

As discussed above in conjunction with FIG. 1, in one embodiment of the invention, an interconnection module 16 (not shown in FIG. 6) intercouples the modules 12 and 14. In another embodiment of the invention as discussed above in conjunction with FIG. 3, the module 16 is not included and the modules 12 and 14 are directly coupled to each other.

Figure 7:
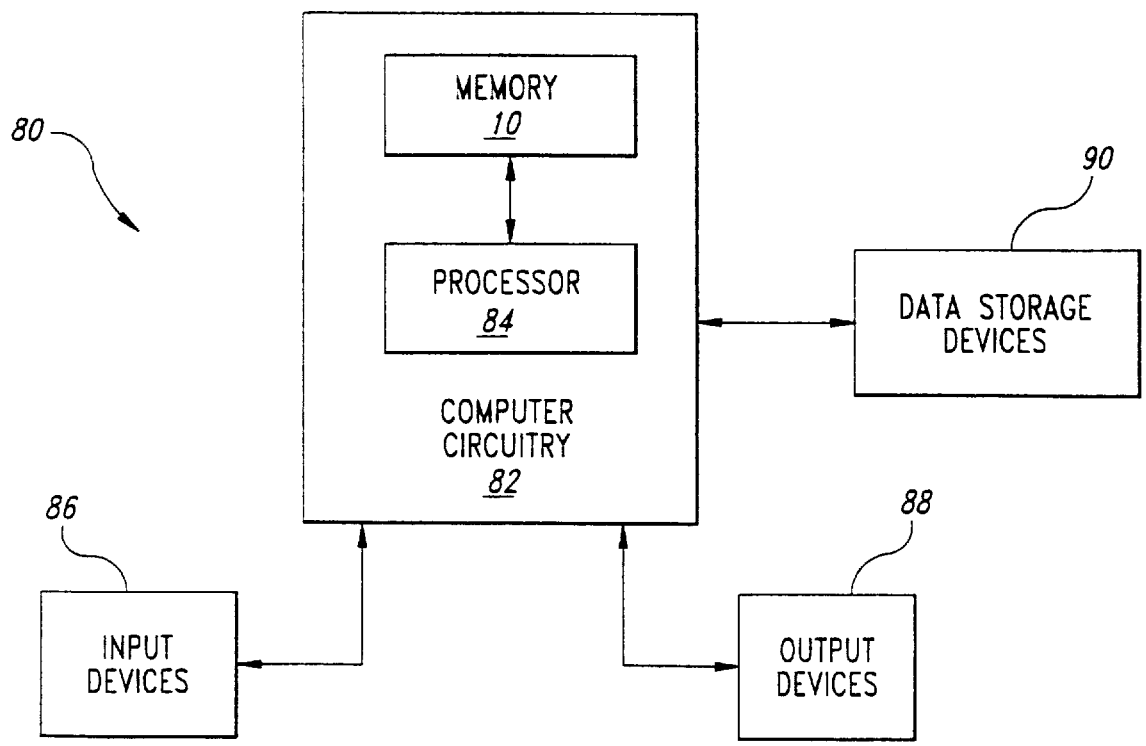
FIG. 7 is a block diagram of a computer system that incorporates the embodiment of the modular memory device of FIG. 6.

FIG. 7 is a schematic block diagram of a computer system 80, which incorporates the memory device 10 of FIG. 1. In another embodiment of the invention, the computer system 80 may incorporate the memory device 46 of FIG. 3 instead of or in addition to the memory device 10. In the described embodiment, the circuitry of memory device 10 has the structure and operates as described in conjunction with FIG. 6. The computer system 80 includes computer circuitry 82 for performing computer functions such as executing software to perform desired calculations and tasks. The computer circuitry 82 typically includes a processor 84 and the memory device 10, which is coupled to the processor 84. One or more input devices 86, such as a keypad or a mouse, are coupled to the computer circuitry 82 and allow an operator (not shown in FIG. 7) to manually input data thereto. One or more output devices 88 are coupled to the computer circuitry 82 to provide the operator with the data generated by the computer circuitry 82. Examples of such output devices 88 include a printer and a video display unit. One or more data-storage devices 90 are coupled to the computer circuitry 82 to store data on or retrieve data from external storage media (not shown). Examples of the storage devices 90 and the corresponding storage media include drives that accept hard and floppy disks, tape cassettes, and compact disc read-only memories (CD-ROMs). Typically, the computer circuitry 82 includes address, data and command buses and a clock line that are respectively coupled to the ADDRESS, DATA and COMMAND buses and the CLK line of the memory device 10.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A circuit, comprising:
   a memory module that is formed on a first die and that includes an array of memory cells;
   a communication module that is formed on a second die and that includes communication circuitry for coupling signals to or from said array; and
   an interconnection module that is formed on a third die and that is electrically coupled to said memory and communication modules, said interconnection module including conductive paths that electrically couple said array to said communication circuitry.

2. The circuit of claim 1 wherein said memory module comprises:
   a read/write circuit coupled to said array and to said communication circuitry; and
   an address decoder coupled to said array and to said communication circuitry.

3. The circuit of claim 1 wherein said conductive paths are disposed on a surface of said interconnection module.

4. The circuit of claim 1 wherein said memory and communication modules are mounted to said interconnection module.

5. A memory circuit, comprising:
   an integrated-circuit package having external terminals;
   a memory-array die disposed within said package;
   an interface die disposed within said package, said interface die including a connection pad that is electrically coupled to one of said package terminals; and
   a coupling module disposed wit said package and electrically coupled to said memory and interface dies, said coupling module including conductive paths that electrically couple said memory die to said interface die.

6. The memory circuit of claim 5 wherein said memory and interface dies and said coupling module are mounted to said package.

7. The memory circuit of claim 5 wherein:
   said memory die comprises memory cells; and
   said interface die comprises data input buffers and data output buffers that are electrically coupled to said memory cells via said coupling module.

8. The memory circuit of claim 5 wherein said coupling module comprises an integrated-circuit die.

9. The memory circuit of claim 5 wherein said coupling module comprises a printed circuit board.

10. A memory device, comprising:
    an integrated-circuit package having external pins;
    an array die disposed within said package, said array die including,
        memory cells,
        a read/write circuit coupled to said memory cells,
        address decoder coupled to said read/write circuit,
        a control circuit coupled to said read/write circuit and said address decoder, and
        a first array set of conductive pads coupled to said read/write circuit;
    a communications die disposed within said package, said communications die including,
        data buffers,
        a first communications set of conductive pads that are electrically coupled to said data buffers and to one or more of said package pins, and
        a second communications set of conductive pads that are coupled to said data buffers; and
    a coupling module disposed within said package and including,
        a first module set of conductive pads that are coupled to said array pads,
        a second module set of conductive pads that are coupled to said second communications set of pads, and
        a first set of conductive paths that interconnect said first and second module sets of pads.

11. The memory device of claim 10, further comprising:
    a peripheral die that includes,
        a peripheral circuit, and
        a peripheral set of conductive pads coupled to said peripheral circuit;
    wherein said array die includes a second array set of conductive pads that are coupled to said address decoder; and
    wherein said coupling module further includes,
        a third module set of conductive pads that are coupled to said peripheral set of pads,
        a fourth module set of conductive pads that are coupled to said second array set of pads, and
        a second set of conductive paths that interconnect said third and fourth module sets of bonding pads.

12. The memory device of claim 10, further comprising:
    a peripheral die that includes,
        a peripheral circuit, and
        a peripheral set of conductive pads coupled to said peripheral circuit; and
    wherein said coupling module further includes,
        a third module set of conductive pads that are coupled to said peripheral set of bonding pads, and
        a second set of conductive paths that interconnect said first and third module sets of bonding pads.

13. The memory device of claim 12 wherein said peripheral die comprises a processor circuit.

14. The memory device of claim 10 wherein said array die includes a conductive pad that is coupled to said address decoder and to one of said package pins.

15. The memory device of claim 10 wherein said array die includes a conductive pad that is coupled to said control circuit and to one of said package pins.

16. The memory device of claim 10 wherein:
    said array die includes a conductive pad that is coupled to said read/write circuit; and
    said communications die includes a conductive pad that is coupled to said pad of said array die.

17. The memory device of claim 10 wherein said array die further includes a self-test circuit that is coupled to said read/write circuit, said address decoder, and said conductive pads of said array die.

18. A memory circuit, comprising:
a circuit housing having a terminal;
a memory-array die disposed within said housing, said array die having first and second surfaces and having a first coupling region disposed on said second surface; and
an interface-circuit die disposed within said housing, said interface die having a third surface that faces said second surface of said memory die, a second coupling region disposed on said third surface and electrically coupled to said first coupling region, and an interface terminal that is electrically coupled to said housing terminal.

19. The memory circuit of claim 18, flier comprising a conductive ball bond disposed between said first and second coupling regions.

20. The memory circuit of claim 19, further comprising:
said memory die having a third coupling region disposed on said first surface; and
a peripheral die having a fourth surface that faces said first surface, said peripheral die having a fourth coupling region disposed on said surface and electrically coupled to said third coupling region.

21. A memory circuit, comprising:
an integrated-circuit package having externally accessible terminals;
a substrate disposed within said package;
a memory-array die disposed within said package and mounted to said substrate; and
an interface die disposed within said package, mounted to said substrate, and electrically coupled to said memory die, said interface die including a pad that is electrically coupled to one of said package terminals.

22. The memory circuit of claim 21 wherein said substrate comprises a ceramic material.

23. The memory circuit of claim 21 wherein said interface die comprises:
a plurality of interface circuits; and
a selection circuit that couples a selected one of said interface circuits to said memory die.

24. The memory circuit of claim 21 wherein said substrate comprises:
a phase-locked loop having an input terminal coupled to receive a clock signal and having an output terminal that provides a synchronized signal; and
a delay-locked loop having an input terminal coupled to said output terminal of said phase-locked loop, said delay-locked loop having a first output terminal that is coupled to and provides a first timing signal to said memory-array die, said delay-locked loop having a second output terminal that is coupled to and provides a second tiring signal to said interface die.

25. A modular integrated circuit, comprising:
an integrated-circuit package having external terminals;
a memory-array die disposed within said package;
an interface die disposed within said package, said interface die including a connection pad that is electrically coupled to one of said package terminals;
a processor die disposed within said package; and
a coupling module disposed within said package and electrically coupled to said memory, interface, and processor dies, said coupling module including a first group of conductive paths that electrically couple said memory die to said interface die, said coupling module including a second group of conductive paths that electrically couple said memory die to said processor die.

26. The memory circuit of claim 25 wherein said memory, interface, and processor dies and said coupling module are mounted to said package.

27. A modular circuit, comprising:
an interconnection die that includes a first function circuit, a first conductive path that is electrically coupled to said function circuit, and a second conductive path;
a first die that includes a second function circuit that is electrically coupled to said first and second conductive paths; and
a second die that includes a third function circuit that is electrically coupled to said second conductive path.

28. The circuit of claim 27 wherein said third function circuit is electrically coupled to said first conductive path.

29. The circuit of claim 27 wherein:
said interconnection die includes a third conductive path that is electrically coupled to said first function circuit; and
said third function circuit is electrically coupled to said third conductive path.

30. The circuit of claim 27 wherein said first and second conductive paths are disposed on a surface of said interconnection die.

31. The circuit of claim 27 wherein said first function circuit comprises a synchronization circuit that is coupled to receive a timing signal and that is operable to distribute said timing signal to said second and third function circuits.

32. The circuit of claim 27 wherein:
said second function circuit comprises a memory array; and
said third function circuit comprises a communication circuit that is operable to couple signals to or from said memory array.

33. A computer system, comprising:
a data input device;
a data output device; and
computing circuitry coupled to said data input and output devices, said computing circuitry including a memory device that includes,
a memory die that includes an array of memory cells,
an interface die that includes signal-interface circuitry that is electrically coupled to said array, and
an interconnection module that is electrically coupled to said memory and interface dies, said interconnection module including conductive paths that electrically couple said memory die to said interface die.

34. The computer system of claim 33 wherein said memory device further includes an integrated-circuit package that houses said memory die, interface die, and interconnection module.

35. The computer system of claim 33 wherein said interconnection module comprises a monocrystalline-silicon die.

36. A method for forming a device, the method comprising:
electrically coupling a first conductive pad of a memory die to a conductive path disposed in a coupling module;
electrically coupling a second conductive pad of a communication die to said conductive path;

electrically coupling a third conductive pad of said communication die to a terminal of a device package; and placing said memory die, communication die, and coupling module in said package.

37. The method of claim 36, further comprising mounting said memory die and said communication die to said coupling module.

38. The method of claim 36 wherein said electrically coupling a third conductive pad comprises wire bonding said third conductive pad to said terminal.

39. The method of claim 36 wherein said electrically coupling a first conductive pad and a second conductive pad comprise flip-chip bonding said first and second conductive pads to said conductive path.

40. A method for forming a memory circuit, the method comprising:

mounting a memory die to a substrate;

mounting an interface die to said substrate;

electrically coupling a first conductive pad of said memory die to a second conductive pad of said interface die;

electrically coupling a third conductive pad of said interface die to a pin of a device package; and disposing said memory die, interface die, and substrate within said package.

41. The method of claim 40 wherein said substrate is formed from glass.

42. The method of claim 40, further comprising testing said memory and interface dies separately before mounting then to said substrate.

43. The method of claim 40, further comprising testing said memory and interface dies after said electrically coupling a first conductive pad.

44. The method of claim 40 wherein said electrically coupling a first conductive pad comprises tape-automated bonding said first conductive pad to said second conductive pad.

45. A method for forming a modular device, comprising:

conductively and rigidly bonding a first pad on a first side of an interface die to a second pad on a first side of a memory-cell die;

conductively coupling a third pad on said interface die to a first pin of an integrated-circuit package; and placing said interface and memory-cell dies within said package.

46. The method of claim 45, further comprising conductively and rigidly bonding a fourth pad on said memory-cell die to a second pin of said package.

47. The method of claim 45, further comprising:

conductively and rigidly bonding a fourth pad on a second side of said memory-cell die to a fifth pad on a peripheral-circuit die; and wherein said placing includes placing said peripheral-circuit die within said package.

48. The method of claim 45, further comprising:

conductively and rigidly bonding a fourth pad on said first side of said memory-cell die to a fifth pad on a peripheral-circuit die; and wherein said placing includes placing said peripheral-circuit die with said package.

49. The method of claim 45 wherein said conductively and rigidly bonding comprises ball bonding.

* * * * *

UNITED STATES PATENT AND TRADEMARK OFFICE
CERTIFICATE OF CORRECTION

PATENT NO. : 5,815,427
DATED : September 29, 1998
INVENTOR(S) : Cloud et al.

It is certified that error appears in the above-identified patent and that said Letters Patent is hereby corrected as shown below:

Column 7, line 52, "wit" should read --within--

Column 9, line 58, "tiring" should read --timing--.

Signed and Sealed this

Tenth Day of April, 2001

Attest:

NICHOLAS P. GODICI

Attesting Officer     *Acting Director of the United States Patent and Trademark Office*